(12) United States Patent
Akhmadi Eko et al.

(10) Patent No.: US 10,900,293 B2
(45) Date of Patent: Jan. 26, 2021

(54) DRILLING TIP, DRILLING TOOL, AND METHOD OF MANUFACTURING DRILLING TIP

(71) Applicant: MITSUBISHI MATERIALS CORPORATION, Tokyo (JP)

(72) Inventors: Wardoyo Akhmadi Eko, Naka (JP); Masahiro Yano, Naka (JP); Toshihiko Matsuo, Naka (JP); Yuki Akahoshi, Naka (JP); Yuichiro Takeuchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 124 days.

(21) Appl. No.: 16/094,774

(22) PCT Filed: Apr. 19, 2017

(86) PCT No.: PCT/JP2017/015749
§ 371 (c)(1),
(2) Date: Oct. 18, 2018

(87) PCT Pub. No.: WO2017/183659
PCT Pub. Date: Oct. 26, 2017

(65) Prior Publication Data
US 2019/0119988 A1    Apr. 25, 2019

(30) Foreign Application Priority Data
Apr. 20, 2016  (JP) .................................. 2016-084176

(51) Int. Cl.
*E21B 10/567* (2006.01)
*C23C 16/455* (2006.01)
(Continued)

(52) U.S. Cl.
CPC ............ *E21B 10/5673* (2013.01); *B22F 7/00* (2013.01); *C04B 35/58* (2013.01); *C04B 41/89* (2013.01);
(Continued)

(58) Field of Classification Search
CPC . B22F 7/00; C04B 35/58; C04B 41/89; C22C 2026/003; C22C 2026/006;
(Continued)

(56) References Cited

U.S. PATENT DOCUMENTS 4,694,918 A     9/1987  Hall
5,011,514 A *   4/1991  Cho ...................... B24D 3/08
                                                51/295
(Continued)

FOREIGN PATENT DOCUMENTS

CN    103796778 A    5/2014
CN    104284747 A    1/2015
(Continued)

OTHER PUBLICATIONS

Office Action dated Mar. 20, 2019 for the related Chinese Patent Application No. 201780011117.1.
(Continued)

*Primary Examiner* — James G Sayre
(74) *Attorney, Agent, or Firm* — Leason Ellis LLP

(57) ABSTRACT

A drilling tip according to the disclosure has a tip body which is provided with a tip portion tapered toward a tip side of the tip body; and a hard layer which is formed on a surface of the tip portion of the tip body, an outermost layer of the hard layer is a cBN sintered material having 70 to 95 vol % of cBN grains, and when a cross-sectional structure of the outermost layer is observed, a binder phase having a width of 1 nm or greater and 30 nm or less and containing Al, B,
(Continued)

and N, and in which a ratio of an O content to an Al content is 0.1 or less exists between neighboring cBN grains.

8 Claims, 11 Drawing Sheets

(51) Int. Cl.
| | |
|---|---|
| *C22C 26/00* | (2006.01) |
| *C04B 35/58* | (2006.01) |
| *C23C 16/01* | (2006.01) |
| *C23C 16/34* | (2006.01) |
| *C04B 41/89* | (2006.01) |
| *B22F 7/00* | (2006.01) |
| *E21C 35/183* | (2006.01) |
| *C23C 16/56* | (2006.01) |
| *E21B 10/46* | (2006.01) |

(52) U.S. Cl.
CPC .............. *C22C 26/00* (2013.01); *C23C 16/01* (2013.01); *C23C 16/34* (2013.01); *C23C 16/45525* (2013.01); *C23C 16/56* (2013.01); *E21B 10/46* (2013.01); *E21C 35/183* (2013.01); *C22C 2026/003* (2013.01); *C22C 2026/006* (2013.01); *C22C 2026/007* (2013.01); *C22C 2026/008* (2013.01)

(58) Field of Classification Search
CPC ........ C22C 2026/007; C22C 2026/008; C22C 26/00; C23C 16/01; C23C 16/34; C23C 16/45525; C23C 16/56; E21B 10/46; E21B 10/5673; E21C 35/183
See application file for complete search history.

(56) References Cited

U.S. PATENT DOCUMENTS

| | | |
|---|---|---|
| 6,001,758 A | 12/1999 | Fukaya et al. |
| 6,051,079 A | 4/2000 | Andersson et al. |
| 2003/0051924 A1 | 3/2003 | Tsuda et al. |
| 2011/0014426 A1* | 1/2011 | Ohtomo ................ C04B 41/009 |
| | | 428/143 |
| 2013/0047397 A1* | 2/2013 | Jonker ..................... B22F 7/06 |
| | | 29/419.1 |
| 2016/0052827 A1 | 2/2016 | Matsuda et al. |

FOREIGN PATENT DOCUMENTS

| | | | |
|---|---|---|---|
| CN | 104418594 A | | 3/2015 |
| EP | 2053198 A | | 4/2009 |
| JP | 02-503454 A | | 10/1990 |
| JP | 06-016476 A | | 1/1994 |
| JP | 08-197307 A | | 8/1996 |
| JP | 2002-349173 A | | 12/2002 |
| JP | 2004-026555 A | | 1/2004 |
| JP | 2011-212832 A | | 10/2011 |
| JP | 5182582 B | | 4/2013 |
| JP | 2014-147988 A | | 8/2014 |
| JP | 2014147988 A | * | 8/2014 |
| WO | WO-89/08727 A | | 9/1989 |

OTHER PUBLICATIONS

Extended European Search Report dated Oct. 21, 2019 for the corresponding European Patent Application No. 17785996.4.
International Search Report dated Jun. 20, 2017 for the corresponding PCT International Patent Application No. PCT/JP2017/015749.

* cited by examiner

HAADF IMAGE OF cBN-cBN INTERFACE TAKEN BY STEM

MAPPING IMAGE OF B

DRILLING TIP, DRILLING TOOL, AND METHOD OF MANUFACTURING DRILLING TIP

CROSS-REFERENCE TO RELATED PATENT APPLICATIONS

This application is a U.S. National Phase Application under 35 U.S.C. § 371 of International Patent Application No. PCT/JP2017/015749, filed Apr. 19, 2017, and claims the benefit of Japanese Patent Application No. 2016-084176, filed on Apr. 20, 2016, all of which are incorporated herein by reference in their entirety. The International Application was published in Japanese on Oct. 26, 2017 as International Publication No. WO/2017/183659 under PCT Article 21(2).

FIELD OF THE INVENTION

The present disclosure relates to a drilling tip which is attached to a tip portion of a drilling tool to perform drilling, a drilling tool which has the drilling tip on a tip portion thereof, and a method of manufacturing the drilling tip.

BACKGROUND OF THE INVENTION

As such a drilling tip, a drilling tip which has a tip body made of a cemented carbide; and a hard layer which is made of a sintered material of polycrystalline diamond harder than the tip body and is coated on a tip portion of the tip body to increase the tool life of a percussion drill bit is known. For example, U.S. Pat. No. 4,694,918 proposes a drilling tip which has a tip body which has a cylindrical posterior end portion and a hemispherical tip portion of which the outer diameter is reduced toward a tip side; and multiple hard layers, each formed of the polycrystalline diamond sintered material, which are coated on the tip portion of the tip body.

In addition, as a drilling tip, a drilling tip which is joined to a tip of a pick attached to an outer periphery of a rotation drum of a drum drilling machine for use in opencast mining or longwall mining is known. U.S. Pat. No. 6,051,079 proposes a drilling tip in which a substantially conical tip portion of a tip body is coated with diamond and/or cubic boron nitride. European Patent Application, Publication No. 2053198 proposes that an outermost layer coated on a substantially conical tip portion of a tip body is selected from polycrystalline diamond, polycrystalline cubic boron nitride, single crystal diamond, and a cubic boron nitride composite material.

Regarding a cubic boron nitride sintered material, Japanese Patent No. 5182582 describes that a high-hardness cubic boron nitride sintered material can be manufactured by using a metallic catalyst. In addition, Japanese Unexamined Publication No. H8-197307 proposes a cutting tool formed of a cubic boron nitride sintered material having a binder phase containing $Al_2O$, $AlB_2$, AlN, $TiB_2$, and TiN in order to improve the strength and toughness.

Technical Problem

However, a polycrystalline diamond sintered material has lower toughness, although having higher wear resistance than a cemented carbide. Accordingly, a polycrystalline diamond sintered material has poor fracture resistance, and in drilling of a super-hard rock layer, a hard layer may chip or be damaged unexpectedly. In addition, a diamond sintered material cannot be used in Fe or Ni mines due to its high affinity. Moreover, its heat-resistant temperature is approximately 700° C., and thus the diamond sintered material cannot be used under conditions where it is exposed to a temperature higher than 700° C. For example, under high-temperature drilling condition of 700° C. or higher as in opencast mining which is performed under a dry environment, diamond is graphitized, and thus the wear resistance is reduced.

In addition, a cubic boron nitride sintered material has a low affinity in Fe or Ni mines, but has a lower hardness than diamond. In the cubic boron nitride sintered material described in Japanese Patent No. 5182582, cracks are likely to occur due to a difference in the coefficient of thermal expansion between the binder phase of metal and the cubic boron nitride sintered material under high-temperature drilling conditions of 700° C. or higher as above. Furthermore, the cubic boron nitride sintered material described in Japanese Unexamined Publication No. H8-197307 has a relatively low hardness, and thus does not have sufficient wear resistance and fracture resistance, whereby it is difficult to use the cubic boron nitride sintered material to a drilling tool. In addition, in such a cubic boron nitride sintered material, in a case where the amount of cubic boron nitride grains contained in the sintered material is increased to improve the hardness, the cubic boron nitride grains are brought into contact with each other, and an unsintered portion which cannot sufficiently react with the binder phase increases. Therefore, there is a problem that a hardness corresponding to the content of the cubic boron nitride grains cannot be obtained.

The disclosure is contrived based on such a background, and an object thereof is to provide a drilling tip which has a hardness comparable to a polycrystalline diamond sintered material, and can be used in Fe or Ni mines or under high-temperature drilling conditions, a drilling tool which has the drilling tip attached thereon, and a method of manufacturing the drilling tip.

SUMMARY OF THE INVENTION

Solution to Problem

In order to achieve the object by solving the problems, a drilling tip according to the disclosure is a drilling tip which is attached to a tip portion of a drilling tool to perform drilling, the drilling tip including: a tip body which is provided with a posterior end portion buried in a tool body of the drilling tool, and a tip portion protruding from a surface of the drilling tool and being tapered toward a tip side of the tip body; and a hard layer which is formed on a surface of the tip portion of the tip body, in which the hard layer is provided with an outermost layer and an intermediate layer interposed between the outermost layer and the tip body, the outermost layer is a cubic boron nitride sintered material having 70 to 95 vol % of cubic boron nitride grains and a binder phase, and when a cross-sectional structure of the outermost layer is observed, a binder phase having a width of 1 nm or greater and 30 nm or less and containing Al, B, and N, and in which a ratio (atomic ratio) of an O content to an Al content is 0.1 or less exists between neighboring cubic boron nitride grains.

In the drilling tip according to the disclosure, the outermost layer preferably has a Vickers hardness of 3,700 to 4,250. In addition, the cubic boron nitride grains preferably have an average grain size of 0.5 to 8.0 μm.

When a cross-sectional structure of the outermost layer is observed, a ratio of: a number of cubic boron nitride grains which have the binder phase having a width of 1 nm or greater and 30 nm or less, and containing Al, B and N between neighboring cubic boron nitride grains: to a total number of the cubic boron nitride grains, is 0.4 or greater, and a ratio of: a number of cubic boron nitride grains which have the binder phase having a width of 1 nm or greater and 30 nm or less, containing Al, B and N, and having an atomic ratio of an O content to an Al content of 0.1 or less between neighboring cubic boron nitride grains: to the number of cubic boron nitride grains which have the binder phase having a width of 1 nm or greater and 30 nm or less and containing Al, B and N between neighboring cubic boron nitride grains, is 0.5 or greater.

The intermediate layer preferably contains 30 to 70 vol % of cubic boron nitride grains or diamond grains.

A drill bit according to the disclosure includes a tool body; and the drilling tip which is attached to a tip portion of the tool body.

A method of manufacturing a drilling tip according to the disclosure is a method of manufacturing a drilling tip having a tip body which is provided with a posterior end portion buried in a tool body of a drilling tool, and a tip portion protruding from a surface of the drilling tool and being tapered toward a tip side of the tip body, and a hard layer which is formed on a surface of the tip portion of the tip body, the hard layer being provided with an outermost layer and an intermediate layer interposed between the outermost layer and the tip body, the method including the steps of: pretreating surfaces of cubic boron nitride grains; obtaining a mixed powder by mixing a raw material powder for a binder phase of the outermost layer and the pretreated cubic boron nitride grains; and sintering the mixed powder, a raw material powder for the intermediate layer, and the tip body at a pressure of 5.0 GPa or greater and a temperature of 1,500° C. or higher.

Advantageous Effects of Disclosure

A drilling tip according to the disclosure has a hardness comparable to a polycrystalline diamond sintered material, and can be used in Fe or Ni mines or under high-temperature drilling conditions.

DETAILED DESCRIPTION OF THE INVENTION

Figure 1:
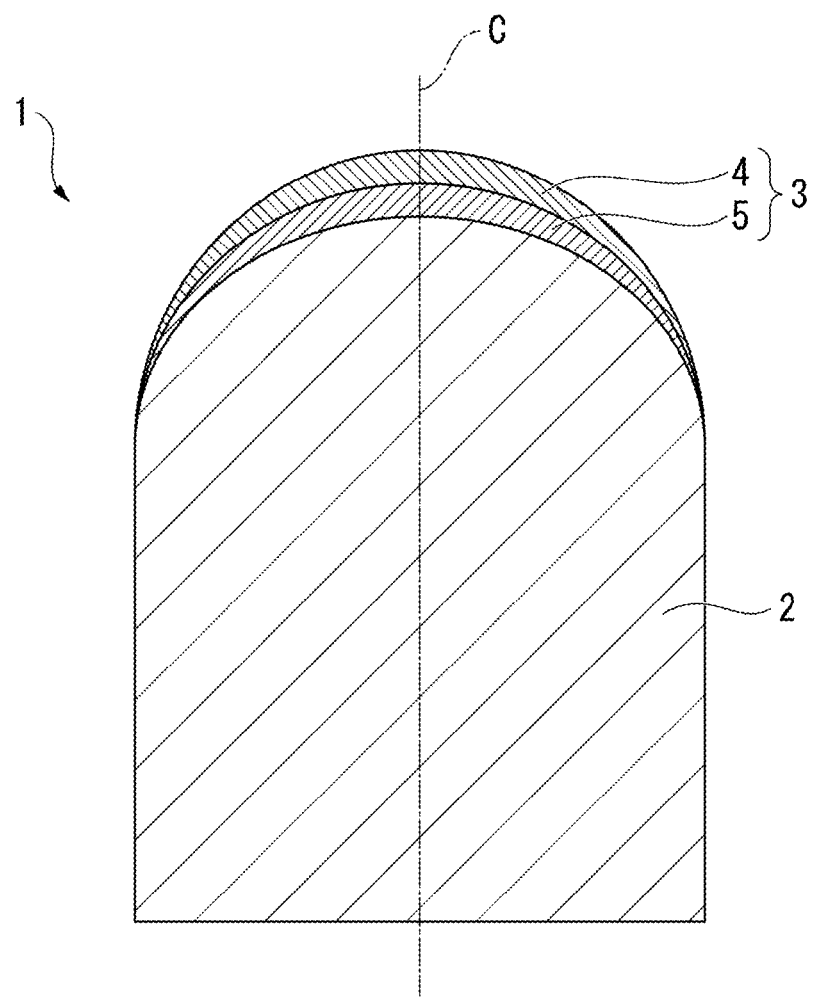
FIG. 1 is a cross-sectional view illustrating a drilling tip according to an embodiment of the disclosure.
Figure 2:
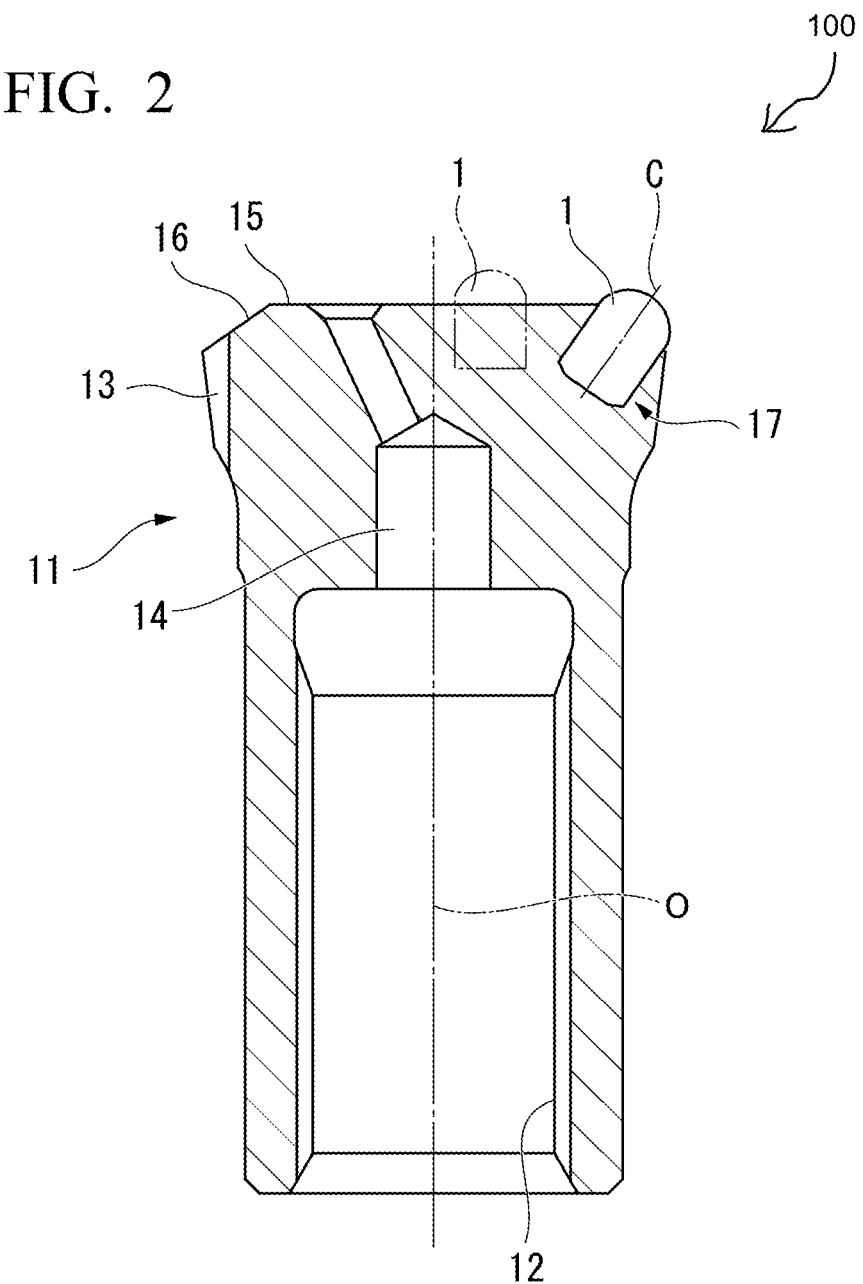
FIG. 2 is a cross-sectional view illustrating a drill bit which has the drilling tip according to the embodiment illustrated in FIG. 1 attached on a tip portion thereof.

FIG. 1 is a cross-sectional view illustrating a drilling tip according to an embodiment of the disclosure. FIG. 2 is a cross-sectional view illustrating a drilling tool 100 according to an embodiment of the disclosure which has the drilling tip according to the embodiment attached thereon. The drilling tip according to this embodiment has a tip body 1, and this tip body 1 is provided with a body 2 which is made of a hard material such as a cemented carbide and a hard layer 3 which is coated on a surface of at least a tip portion (upper portion in FIG. 1) of the body 2 and has a higher hardness (Vickers hardness) than the body 2.

In the tip body 1, a posterior end portion (lower portion in FIG. 1) has a cylindrical or disk shape with a tip central line C as a center, and a tip portion has a hemispherical shape having a center on the tip central line C with the same radius as that of the cylindrical or disk shape of the posterior end portion in this embodiment and is formed into a tapered shape in which the outer diameter from the tip central line C is gradually reduced toward a tip side. That is, the drilling tip according to this embodiment is a button tip.

In this embodiment, as illustrated in FIG. 1, only the tip portion of the tip body 1 is coated with the hard layer 3, and the tip portion of the tip body 1 including the hard layer 3 is formed to have the above-described hemispherical shape. In addition, in this embodiment, as illustrated in FIG. 1, the hard layer 3 has a two-layer structure composed of an outermost layer 4 and an intermediate layer 5 which is interposed between the outermost layer 4 and the body 2.

A drill bit as an embodiment of the drilling tool which has the drilling tip attached on the tip portion thereof has a bit body 11 made of steel or the like and has a substantially bottomed cylindrical shape with an axial line O as a center as illustrated in FIG. 2. The bottomed portion of the bit body is a tip portion (upper portion in FIG. 2), and the drilling tip is attached on the tip portion. In addition, a female thread portion 12 is formed at the inner periphery of a posterior end portion (lower portion in FIG. 2) of the cylindrical shape, and a drill rod (not shown) connected to a drilling machine is screwed in the female thread portion 12. By transmission of a striking force and an impelling force toward a tip side in a direction of the axial line O and a rotating force around the axial line O from the drill rod to the female thread portion 12, the drilling tip breaks bedrock, thereby forming a borehole.

The tip portion of the bit body 11 has a slightly larger outer diameter than the posterior end portion. At the outer periphery of the tip portion, a plurality of discharge grooves 13 extending in parallel to the axial line O are formed at intervals in a circumferential direction. Crushed rubbish generated by breaking bedrock using the drilling tip is discharged to a posterior end side of the bit body 11 through the discharge grooves 13. In addition, a blow hole 14 is formed along the axial line O from a bottom surface of the female thread portion 12 of the bottomed bit body 11. This blow hole 14 is obliquely branched in the tip portion of the bit body 11 and opened to a tip surface of the bit body 11. A fluid such as compressed air supplied via the drill rod is ejected from the blow hole 14, and thus discharge of crushed rubbish is promoted.

The tip surface of the bit body 11 is provided with a circular face surface 15 around an axial line O perpendicular to the axial line O on the inner peripheral side as a center and a frustconical gauge face 16 positioned at an outer periphery of the face surface 15 and extending toward the posterior end side as extending toward the outer periphery side. The blow hole 14 is opened to the face surface 15, and a tip of the discharge groove 13 is opened to the outer peripheral side of the frustconical gauge face 16. Each of the face surface 15 and the frustconical gauge face 16 has a plurality of fitting holes 17 having a circular cross section that are formed perpendicular to the face surface 15 and the frustconical gauge face 16 to avoid the opening portions of the blow hole 14 and the discharge groove 13.

The drilling tip is attached in such a manner that it is fitted in by pressing, shrink fitting, or the like, or brazed to be fixed to, that is, buried in the fitting holes 17, in a state in which the posterior end portion of the tip body 1 is buried as illustrated in FIG. 2. The tip portion of the tip body 1 having the hard layer 3 formed thereon protrudes from the face surface 15 and the frustconical gauge face 16 and breaks bedrock with the above-described striking force, impelling force, and rotating force.

Next, a configuration of the outermost layer 4 of the hard layer 3 will be described using FIGS. 3 to 13. The outermost layer 4 is formed of a cubic boron nitride sintered material (hereinafter, also referred to as "cBN sintered material") in which the main binder phase is formed of ceramics. The cBN sintered material includes cubic boron nitride grains (hereinafter, also referred to as "cBN grains") of which the content is 70 to 95 vol % with respect to the whole cBN sintered material, and a binder phase binding the cBN grains to each other. In a cross-sectional structure seen by observing an optional cross section of the outermost layer 4, a binder phase having a width of 1 nm or greater and 30 nm or less exists between neighboring cBN grains. This binder phase includes at least aluminum (Al), boron (B), and nitrogen (N), and a ratio (O/Al) of the oxygen (O) content to the Al content in the binder phase is 0.1 or less (atomic ratio calculated from an area ratio of the cross section). The lower limit value of the ratio of the O content to the Al content is 0.

The above-described binder phase strongly binds the cBN grains to each other since it has a low oxide content. In addition, in the cBN sintered material having the above-described binder phase, the cBN grains are brought into contact with each other, and an unsintered portion which cannot sufficiently react with the binder phase is small. Therefore, such a cBN sintered material has a high hardness. By forming the outermost layer 4 using such a cBN sintered material, the drilling tip can have a hardness comparable to a polycrystalline diamond sintered material, and thus the wear resistance of the drilling tip can be secured. In a case where no binder phase, having a width of 1 nm or greater and 30 nm or less and containing Al, B, and N, and in which a ratio (atomic ratio) of the O content to the Al content is 0.1 or less, exists between neighboring cBN grains, the cBN grains cannot be sufficiently bound, and thus the outermost layer 4 has a low hardness, or breakage starting from the inside of the binder phase is likely to occur.

As long as the main binder phase is formed of ceramics, the configuration of a binder phase other than the binder phase having a width of 1 nm or greater and 30 nm or less and existing between neighboring cBN grains among the binder phases formed in the cBN sintered material is not particularly limited, and preferably includes one or more selected from a nitride, a carbide, a carbonitride, and a boride of Ti, a nitride, a boride, and an oxide of Al, and solid solutions of two or more thereof; and inevitable impurities.

The Vickers hardness of the outermost layer 4 is preferably 3,700 to 4,250. In a case where the Vickers hardness is less than 3,700, it is difficult to impart sufficient wear resistance to the outermost layer 4. In a case where the Vickers hardness is greater than 4,250, the outermost layer 4 is likely to fracture.

Since the content of the cBN grains in the outermost layer 4 is 70 to 95 vol %, the above-described cross-sectional structure can be formed, and the Vickers hardness of the outermost layer 4 can be adjusted within the above-described range. In a case where the content of the cBN grains is less than 70 vol %, the amount of the cBN grains is small, and thus the Vickers hardness of the outermost layer 4 cannot be adjusted to 3,700 or greater. In addition, it is difficult to form a binder phase having a width of 1 nm or greater and 30 nm or less between the cBN grains. Furthermore, between the cBN grains, the amount of a compound containing Al, B, and N in the binder phase becomes relatively smaller than that of a binder phase component (for example, Ti or Ta compound or boride of Al) other than the above compound. Therefore, uniform sintering cannot be performed, and a structure exhibiting the above-described effects cannot be obtained. That is, in comparison to the binder phase containing Al, B, and N, the Ti compound or Al boride has a low adhesion strength to the cBN grains, and thus an interface between the Ti compound or Al boride and the cBN grains is likely to become a starting point of cracks. As a result, the fracture resistance is reduced. In a case where the content of the cBN grains is greater than 95 vol %, voids to be a starting point of cracks are likely to be formed in the sintered material, and thus the fracture resistance is reduced. The content of the cBN grains is preferably 70 to 92 vol %, and more preferably 75 to 90 vol %, but not limited thereto.

The average grain size of the cBN grains is preferably 0.5 to 8.0 μm. In a case where such cBN grains are dispersed in the cBN sintered material, high fracture resistance can be imparted to the outermost layer 4. Specifically, it is possible to suppress the occurrence of chipping starting from irregularities formed due to falling-off of the cBN grains from a surface of the outermost layer 4 during drilling. In addition, propagation of cracks proceeding from the interface between the cBN grains and the binder phase or cracks proceeding through the cBN grains, occurring by a stress applied to the outermost layer 4 during drilling, can be suppressed by the cBN grains dispersed in the cBN sintered material. The average grain size of the cBN grains is more preferably 0.5 to 3.0 μm, but not limited thereto.

In a case where a visual field in which one side is 5 times the average grain size of the cBN grains is set as one visual field, it is preferable that in the observation of an optional cross section of the outermost layer 4 in 5 or more visual fields, between neighboring cBN grains, a binder phase having a width of 1 nm or greater and 30 nm or less and containing Al, B, and N, and in which a ratio O/Al of the O content to the Al content is 0.1 or less, be observed in 60% or greater of the total number of visual fields observed. The fact that the content of such a binder phase is large means that there are many networks in which the neighboring cBN grains are strongly bound by the binder phase. Accordingly, the larger the number of visual fields in which such a binder phase is observed, the more excellent the hardness of the outermost layer 4. The number of visual fields in which such a binder phase is observed is more preferably 80% or greater of the total number of visual fields, and even more preferably 100% (the binder phase is observed in all of the visual fields).

In the observation of an optional cross section of the outermost layer 4, a ratio (q/Q) of the number (q) of cBN grains with a binder phase, which has a width of 1 nm or greater and 30 nm or less and includes Al, B and N between the neighboring cBN grains, to the number (Q) of all of the cBN grains is preferably 0.4 or greater. In addition, a ratio (n/N) of the number (n) of cBN grains with a binder phase, which has a width of 1 nm or greater and 30 nm or less, includes Al, B and N, and exists between the neighboring cBN grains, and in which a ratio O/Al of the O content to the Al content is 0.1 or less, to the number (N) of cBN grains with a binder phase, which has a width of 1 nm or greater and 30 nm or less, includes Al, B and N, and exists between the neighboring cBN grains, is preferably 0.5 or greater. The fact that the ratio q/Q and the ratio n/N are high means that the cBN grains are strongly bound by the binder phase. Accordingly, in a case where the ratio q/Q is 0.4 or greater and the ratio n/N is 0.5 or greater, the hardness of the outermost layer 4 can be improved. The upper limit of the value of the ratio q/Q is preferably 1, and the value of q/Q is more preferably 0.6 to 1. The value of the ratio n/N is preferably 0.6 to 1, and more preferably 0.8 to 1.

The binder phase which exists between neighboring cBN grains, has a width of 1 nm or greater and 30 nm or less, and contains Al, B, and N may exist in places between the neighboring cBN grains, or one binder phase may extend between the cBN grains (a cBN grain may be adjacent to another cBN grain via one binder phase described above).

Regarding the outermost layer 4 of the drilling tip according to this embodiment, procedures for specifying the above-described configuration will be described hereinafter.

<Average Grain Size of cBN Grains>

The average grain size of the cBN grains can be obtained as follows.

First, a cross-sectional structure of the cBN sintered material is observed by a scanning electron microscope (SEM) to obtain a secondary electron image. For example, in a case where the average grain size of the cBN grains before sintering is 3 μm, the secondary electron image has a size of 15 μm×15 μm (5-time angle of the average grain size of the cBN grains before sintering).

Next, the secondary electron image is displayed in monochrome with 256 shades of gray ranging from 0 corresponding to black to 255 corresponding to white. Using an image having such a pixel value that the ratio of a pixel value of cBN grain portions to a pixel value of binder phase portions is 2 or greater, a binarization process is performed such that the cBN grains are black. In this image, the pixel value of the cBN grains portions or the binder phase portions is obtained from an average within a region of approximately 0.5 μm×0.5 μm. It is preferable that in the same image, average pixel values of at least 3 regions be obtained, and the obtained values be defined as contrast of the regions. Accordingly, the cBN grains and the binder phase are distinguished from each other. After the above-described binarization process, a separation process is performed for a portion thought to be cBN grains brought into contact with each other. For example, cBN grains thought to be brought into contact with each other are separated using watershed as an image process operation. In this manner, portions corresponding to cBN grains are extracted by the image process from the image obtained by performing the binarization process on the secondary electron image.

The portions (black portions) corresponding to the cBN grains extracted by the above-described process are subjected to grain analysis, and maximum lengths of the portions corresponding to the cBN grains are obtained, respectively. The obtained maximum lengths are defined as maximum lengths of the respective cBN grains, and the maximum lengths are defined as diameters of the respective cBN grains. Volumes of the respective cBN grains are calculated from the obtained diameters by assuming that the cBN grains are spheres. Based on the volumes of the respective cBN grains, a cumulative distribution of the grain sizes of the cBN grains is obtained. Specifically, the sum of the volumes of the respective cBN grains and the volumes of cBN grains having a diameter which is not greater than the diameters of the above cBN grains is obtained as an integrated value. Regarding the respective cBN grains, a graph having a vertical axis representing a volume percentage [%] which is a ratio of the integrated value of the respective cBN grains to the sum of the volumes of all of the cBN grains and a horizontal axis representing a diameter [pin] of the respective cBN grains is drawn. A diameter (median diameter) in which the volume percentage is 50 vol % is defined as an average grain size of the cBN grains in one image.

The average of the average grain sizes obtained by performing the above-described process on at least 3 secondary electron images is defined as an average grain size [pin] of the cBN grains in the outermost layer 4. In such grain analysis, a length (ρm) per pixel is set using a value of a scale known in advance by SEM. In addition, in the grain analysis, a region having a diameter which is less than 0.02 μm is not calculated as a grain in order to remove noise.

<Content of cBN Grains>

The content of the cBN grains can be adjusted by adjusting the mixing ratio between a cBN grain powder and a raw material powder for binder phase formation in the formation of the outermost layer 4. The content can be confirmed as follows. That is, an optional cross section of the outermost layer 4 is observed by SEM to obtain a secondary electron image. In the obtained secondary electron image, portions corresponding to cBN grains are extracted by the same image process as above. An area occupied by the cBN grains is calculated by image analysis, and a ratio of the cBN grains in one image is obtained. The average of the contents of the cBN grains obtained by processing at least 3 images is defined as a content of the cBN grains in the outermost layer 4. A square region in which one side has a length which is 5 times the average grain size of the cBN grains is preferably an observation region used in the image process. For example, in a case where the cBN grains have an average grain size of 3 μm, a visual field region of approximately 15 μm×15 μm is preferable.

<Binder Phase Which Exists Between Neighboring cBN Grains, Having Width of 1 nm or greater and 30 nm or less, and Containing Al, B, and N>

Figure 3:
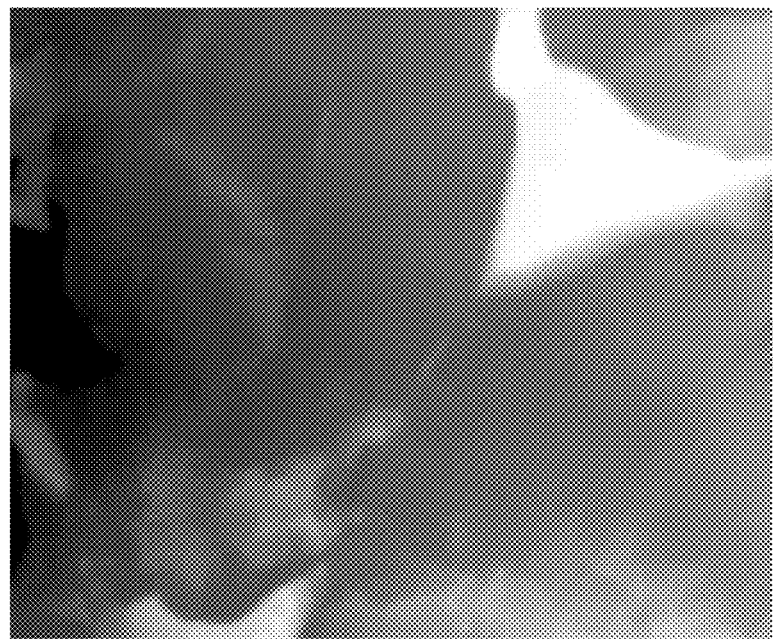
FIG. 3 is a high angle annular dark field (HAADF) image (80,000 magnifications), taken by a scanning transmission electron microscope (STEM), showing an interface between two neighboring cubic boron nitride grains in a cross section of an outermost layer coated on a tip portion of the drilling tip.
Figure 4:
FIG. 4 is a binarized image of a mapping image of B in the visual field of FIG. 3.
Figure 5:
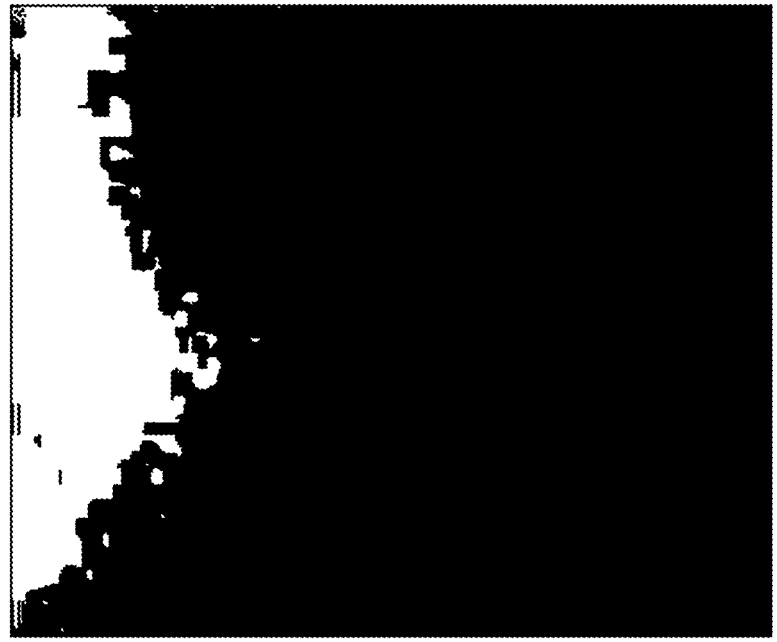
FIG. 5 is a binarized image of a mapping image of N in the visual field of FIG. 3.
Figure 6:
FIG. 6 is a binarized image of a mapping image of Al in the visual field of FIG. 3.

Whether a binder phase having a width of 1 nm or greater and 30 nm or less and containing Al, B, and N exists between neighboring cBN grains is observed as follows. First, an optional cross section of the outermost layer 4 is polished, and an interface between two neighboring cBN grains illustrated in FIG. 3 is observed using a scanning transmission electron microscope (STEM). FIG. 3 is a high angle annular dark field (HAADF) image (80,000 magnifications), taken by observing the interface between the cBN grains using the STEM. The thickness of the observation sample is preferably 3 nm to 70 nm. It is not preferable that the thickness be smaller than 3 nm since the quantity of characteristic X-rays to be detected is reduced in elemental mapping, and thus a long period of time is taken for the measurement, and the sample is likely to be damaged. It is not preferable that the thickness be larger than 70 nm, since it becomes difficult to perform image analysis. The size of the observation image is increased from 150 nm (vertical)× 150 nm (horizontal) to approximately 500 nm (vertical)×500 nm (horizontal), and the resolution is increased to 512×512 pixels or more.

Next, in the same observation region, elemental mapping images (see FIGS. 4 to 6 and 12) of B, N, Al, and O are obtained. These elemental mapping images are images obtained by conversion into a ratio (atm %) of the content of each element with respect to a total of the contents of the four elements in order to remove the background. Based on these images, whether a binder phase having a width of 1 nm or greater and 30 nm or less and containing Al, B, and N exists between neighboring cBN grains is confirmed in accordance with the following procedures (a) to (d), and a ratio of Al and a ratio of O in the binder phase is obtained.

(a) From the mapping images of B and N (see FIGS. 4 and 5), it is confirmed that the observed region is a region in which two or more cBN grains exist and an observation target region.

Figure 7:
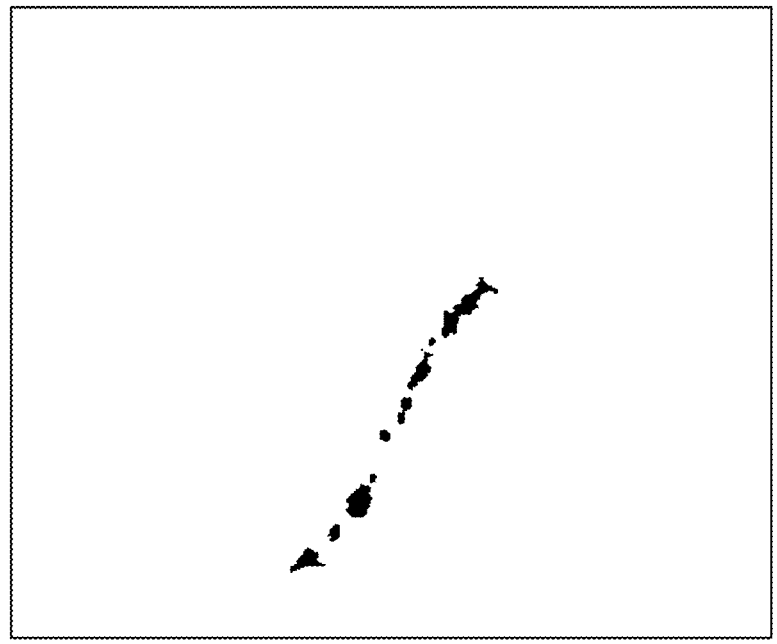
FIG. 7 is a view illustrating a region in which B, N, and Al overlap each other in FIGS. 4 to 6.

(b) The mapping image of Al (FIG. 6), the mapping image of B (FIG. 4), and the mapping image of N (FIG. 5) are superimposed to specify a region in which these mapping images overlap each other as a binder phase existing between cBN grains and containing Al, B, and N (FIG. 7). The width of the binder phase is determined as follows.

(b1) In a case where one binder phase extends between cBN grains, that is, in a case where one Al island overlaps with a region in which B and N exist, first, a long axis is obtained in the mapping image of Al when the Al island corresponding to the binder phase is approximated to an ellipse. Specifically, the Al island overlapping the region in which B and N exist is extracted by an image process in the same manner as in the above-described measurement of the average grain size of the cBN grains, and a maximum length is defined as a long axis when the extracted island is approximated to an ellipse by image analysis. This long axis is defined as an interface boundary line between the cBN grains.

Figure 8:
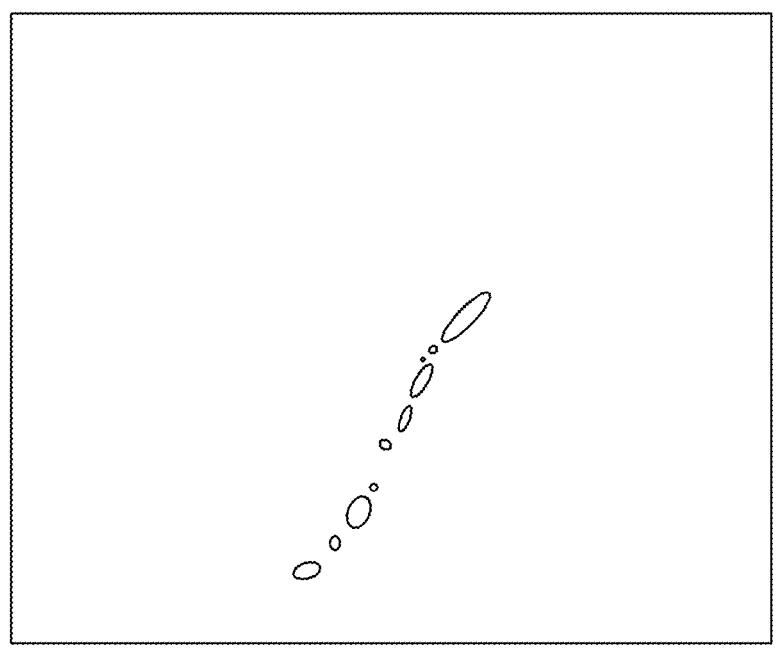
FIG. 8 is a view illustrating a state in which the region (island) in which B, N, and Al overlap each other in FIG. 7 is approximated to an ellipse by an image process.
Figure 9:
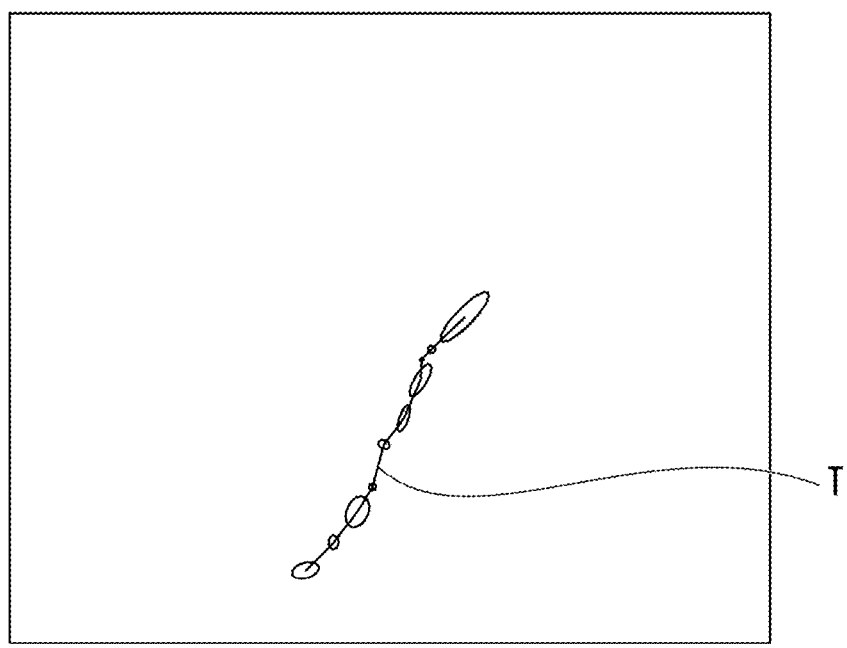
FIG. 9 is a view in which an interface boundary line, formed of a polygonal line drawn by connecting midpoints of short axes of ellipses by straight lines, is drawn in FIG. 8.

(b2) In a case where a binder phase exists in places between cBN grains, that is, in a case where an Al island overlapping a region in which B and N exist is divided into two or more, the Al islands overlapping the region in which B and N exist are extracted by an image process in the same manner as in the above-described measurement of the average grain size of the cBN grains (FIG. 7). Next, each of the islands extracted by the image process is approximated to an ellipse (FIG. 8). In addition, a short axis of each ellipse is obtained. In each short axis, a midpoint is obtained, and neighboring midpoints are connected by straight lines to draw a polygonal line T. This polygonal line T is defined as an interface boundary line between the cBN grains (FIGS. 9 and 10).

Figure 10:
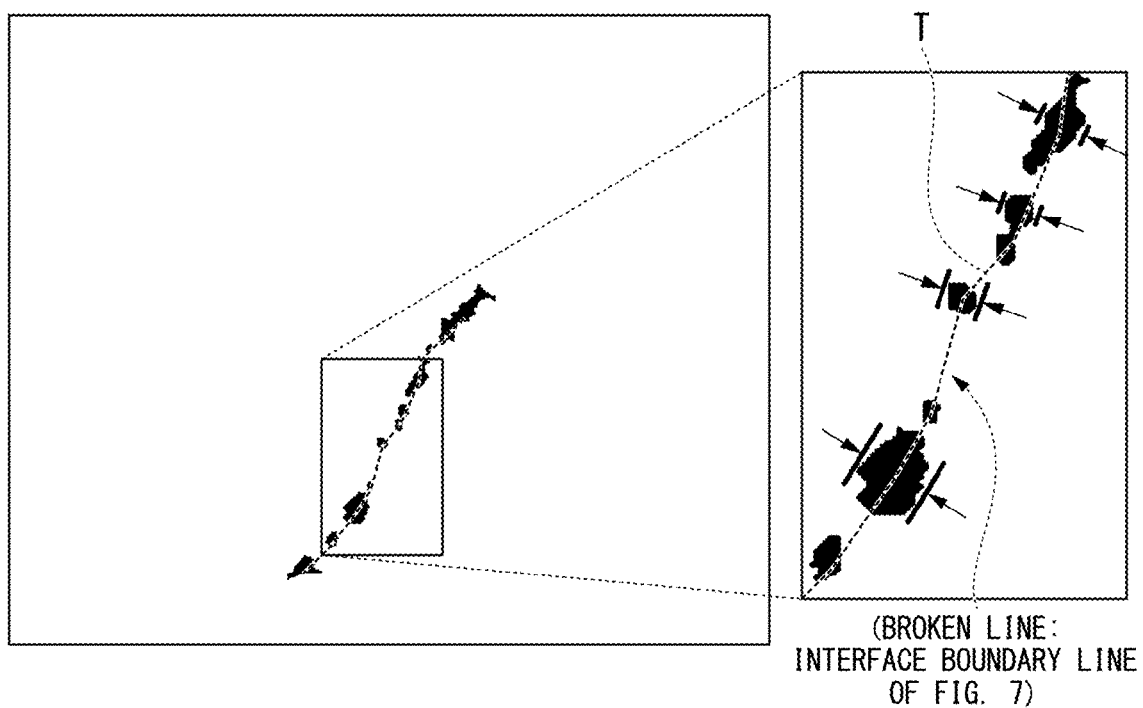
FIG. 10 shows a view in which an interface boundary line is drawn in the region in which B, N, and Al overlap each other in FIG. 7, and a partial enlarged view illustrating a width of a binder phase between cubic boron nitride grains obtained from the interface boundary line.
Figure 11:
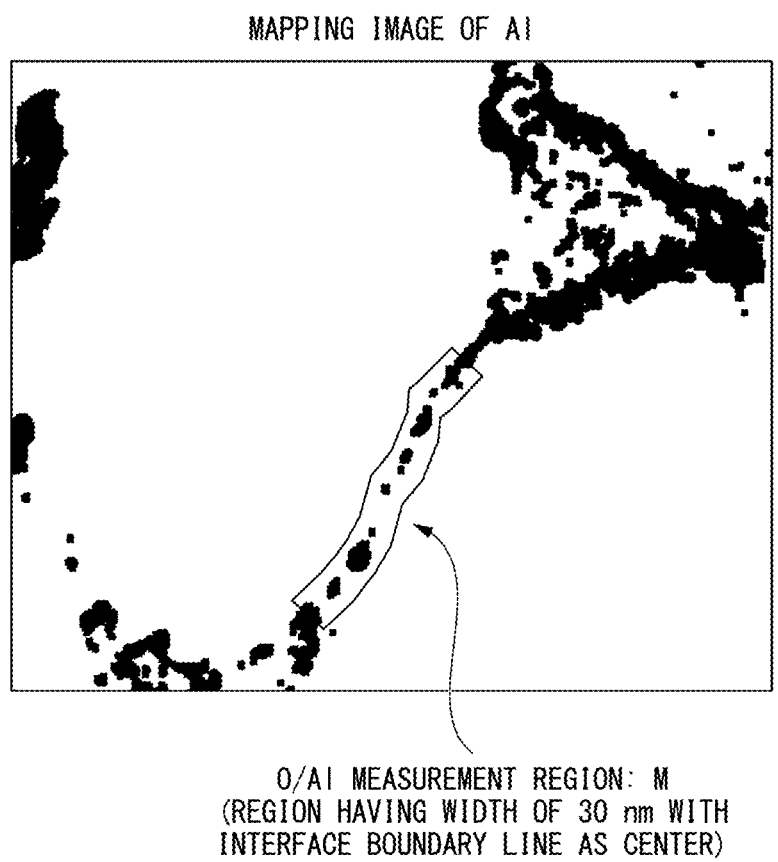
FIG. 11 is a view in which a measurement region having a width of 30 nm with an interface boundary line as a center is drawn in FIG. 6.
Figure 12:
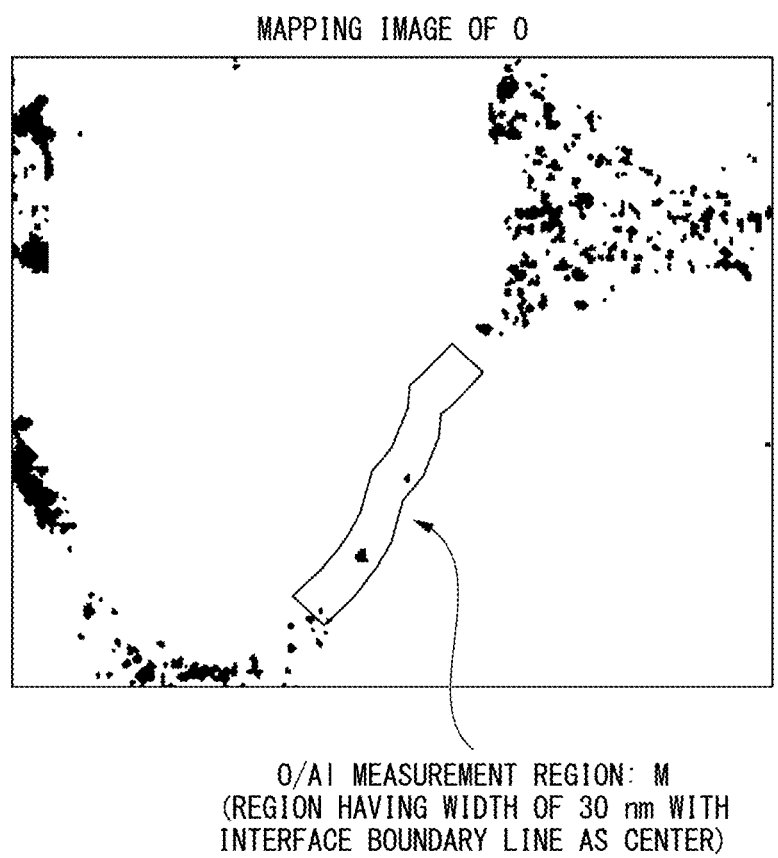
FIG. 12 is a view in which a measurement region is drawn in a binarized image of a mapping image of O in the visual field of FIG. 3.
Figure 13:
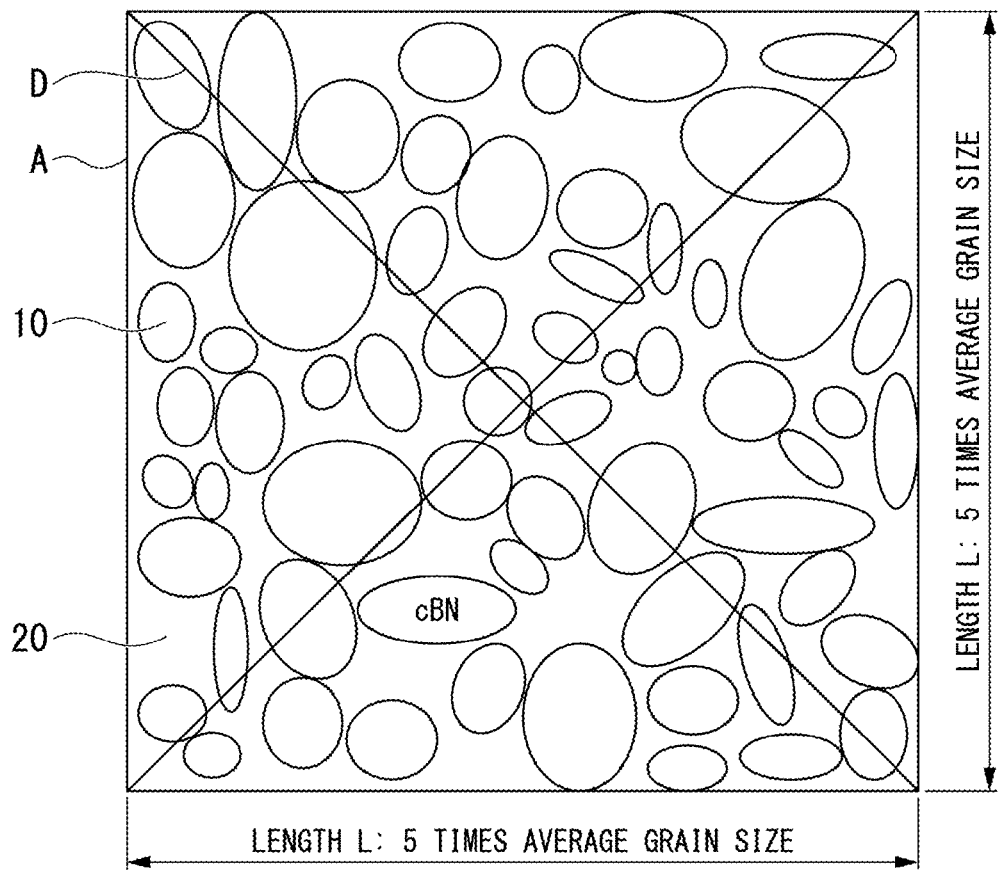
FIG. 13 is a schematic view illustrating a method of measuring a ratio of the number of cubic boron nitride grains with a binder phase, which has a width of 1 nm or greater and 30 nm or less exists between neighboring cubic boron nitride grains, to a total number of cubic boron nitride grains.

(b3) In the mapping image of Al, a width of the Al island overlapping the interface boundary line obtained in (b1) or (b2) in a direction perpendicular to the interface boundary line is measured (FIG. 10). The width of the Al island is measured at at least 3 places. Specifically, in a case where 3 or more Al islands exist, maximum widths of at least 3 Al islands are measured. The average of the measured widths is defined as a width of a binder phase existing between neighboring cBN grains. In a case where the number of Al islands is 2 or smaller, maximum widths of the Al islands are measured. In a case where the width is 1 nm or greater and 30 nm or less, the width of the binder phase existing between the cBN grains and containing Al, B, and N is regarded to be 1 nm or greater and 30 nm or less.

(c) Next, the Al content and the O content of the binder phase are obtained as follows. First, using images (FIGS. 11 and 12) obtained by subjecting the mapping images of Al and O to a binarization process, a measurement region M having a width of 30 nm with the interface boundary line confirmed in (b) as a center is determined. This region M is a region surrounded by two congruent lines, which are parallel to and separated from the interface boundary line by a distance of 15 nm, and two straight lines connecting end portions of the region M. From the image obtained by subjecting the mapping image of Al to the binarization process, an area of Al of a portion where B, N, and Al overlap in the region M is obtained. Similarly, an area of O in the region M is obtained. A ratio (area %) of the area of O to the area of Al obtained as above in the region M is defined as a ratio O/Al (atomic ratio) of the O content to the Al content in the binder phase.

<Ratio (q/Q) of cBN Grains in which Binder Phase Having Width of 1 nm or Greater and 30 nm or Less and Containing Al, B, and N Exists Between Neighboring cBN Grains>

The ratio (q/Q) of the number (q) of cBN grains with a binder phase, which has a width of 1 nm or greater and 30 nm or less and includes Al, B and N, between neighboring cBN grains, to the number (Q) of all of the cBN grains can be measured as follows. First, in an optional cross section of the outermost layer 4, a square region in which a length L of one side is 5 times the average grain size of cBN grains 10 is determined as one measurement visual field range A as illustrated in the schematic view of FIG. 13. For example, in a case where the average grain size of the cBN grains is 1 μm, a square region of 5 μm×5 μm is determined as one measurement visual field range.

Next, a diagonal line D is drawn from a vertex of the square measurement visual field range A, and the number $Q_1$ of cBN grains 10 overlapping the diagonal line D is counted. In addition, whether a binder phase 20 having a width of 1 nm or greater and 30 nm or less and containing Al, B, and N exists between each of the cBN grains 10 overlapping the diagonal line D and a cBN grain 10 neighboring thereto is specified by the above-described method. The number $q_1$ of cBN grains 10 specified as being grains with a binder phase 20, which has a width of 1 nm or greater and 30 nm or less and includes Al, B and N between the neighboring cBN grains, 10 is counted. Using the number $q_1$ of cBN grains 10 and the number $Q_1$ of cBN grains 10 obtained, a value of $q_1/Q_1$ is calculated. $q_1/Q_1$ is calculated in at least 5 visual fields, and an average thereof is defined as the above-described ratio q/Q.

<Ratio (n/N) of cBN Grains in which Binder Phase Having Width of 1 nm or Greater and 30 nm or Less and Containing Al, B, and N, and in which Ratio of O Content to Al Content is 0.1 or Less Exists Between Neighboring cBN Grains>

The ratio (n/N) of the number (n) of cBN grains with a binder phase, which has a width of 1 nm or greater and 30 nm or less and includes Al, B, and N, and in which a ratio O/A of the O content to the Al content is 0.1 or less exists between the neighboring cBN grains, to the number (N) of cBN grains with a binder phase, which has a width of 1 nm or greater and 30 nm or less and includes Al, B and N between the neighboring cBN grains, can be measured as follows. First, in the schematic view of FIG. 13, as described above, cBN grains 10 with a binder phase 20, which has a width of 1 nm or greater and 30 nm or less and includes Al, B and N between the cBN grains, 10 are specified among the cBN grains overlapping the diagonal line D, and the number $N_1$ of the above cBN grains is counted. Next, among these cBN grains 10, cBN grains 10 in which the ratio O/Al of the O content to the Al content of a binder phase 20 having a width of 1 nm or greater and 30 nm or less and containing Al, B, and N is 0.1 or less are specified by the above-described method, and the number $n_1$ of the above cBN grains is counted. Using the number $n_1$ of cBN grains 10 and the number $N_1$ of cBN grains 10 obtained, a value of $n_1/N_1$ is calculated. $n_1/N_1$ is calculated in at least 5 visual fields, and an average thereof is defined as the above-described ratio n/N.

At least one intermediate layer 5 is provided between the outermost layer 4 and the body 2. Accordingly, it is possible to prevent the outermost layer 4 from being peeled. That is, in a case where an outermost layer 4 formed of the above-described cBN sintered material is directly formed on the body 2, a stress remains after sintering due to a difference in the shrinkage ratio between the outermost layer 4 and the body 2 made of a hard material such as a cemented carbide, and cracks occur between an interface between the body 2 and the outermost layer 4. In this embodiment, since the intermediate layer 5 is provided between the outermost layer 4 and the body 2, the intermediate layer 5 functions as a stress relaxation layer. As a result, it is possible to suppress the occurrence of cracks, and it is possible to prevent the outermost layer 4 from being peeled.

The configuration of the intermediate layer 5 is not particularly limited as long as the intermediate layer has a less hardness (Vickers hardness) which is less than the outermost layer 4 and greater than the body 2. For example, the intermediate layer 5 may be a cBN sintered material obtained by sintering with a catalytic metal containing Al and at least one of Co, Ni, Mn, and Fe. In addition, a metallic additive containing at least one of W, Mo, Cr, V, Zr, and Hf may be added to the metallic catalyst. The intermediate layer 5 may be formed of a polycrystalline diamond sintered material including diamond, cobalt, and tungsten carbide.

Here, the intermediate layer 5 preferably contains 30 to 70 vol % of cBN grains or diamond grains. In a case where the content of the cBN grains or diamond grains which are hard grains is 30 vol % or less, the intermediate layer 5 has a less hardness than the body 2. In a case where the content is 70 vol % or greater, the intermediate layer 5 has the same hardness as the outermost layer 4. Accordingly, the content of the cBN grains or diamond grains in the intermediate layer 5 is preferably 30 to 70 vol % to allow the intermediate layer to function as a stress relaxation layer.

In this embodiment, the intermediate layer 5 has a single layer structure. However, the intermediate layer 5 may have a multi-layer structure. In a case where the intermediate layer 5 has a multi-layer structure of 3 layers or more, it is preferable that from the side of the outermost layer 4 toward the side of the body 2, the content of the cBN grains or diamond grains in the intermediate layer 5 be reduced and the Vickers hardness be thus reduced.

The thickness of the outermost layer 4 on the tip central line C is preferably 0.3 mm to 1.5 mm. In a case where the thickness of the outermost layer 4 is 0.3 mm or smaller, there is a concern that the drilling tip may be rapidly abraded and its life may thus be reduced. In a case where the thickness of the outermost layer 4 is 1.5 mm or larger, there is a concern that cracks may be likely to occur due to a residual stress during sintering, and thus unexpected fractures may be caused during drilling. The thickness of the outermost layer 4 is more preferably 0.4 mm to 1.3 mm. In addition, the total thickness of the intermediate layer 5 on the tip central line C is preferably 0.2 mm to 1.0 mm. In a case where the thickness of the intermediate layer 5 is 0.2 mm or smaller, there is a concern that it may be difficult to form a uniform layer, and thus it may be difficult to absorb a residual stress during sintering, and the intermediate layer may not function to relax the stress of the tip. In a case where the thickness of the intermediate layer 5 is 1.0 mm or larger, the total thickness of the hard layer 3 (outermost layer 4 and intermediate layer 5) is increased, and thus there is a concern that cracks may be likely to occur due to a residual stress during sintering, and thus unexpected fractures may be caused during drilling. The total thickness of the intermediate layer 5 is more preferably 0.3 mm to 0.8 mm.

Next, a method of manufacturing a drilling tip including the outermost layer 4 and the intermediate layer 5 described above will be described.

The method of manufacturing a drilling tip according to this embodiment includes a step of performing a pretreatment on surfaces of cBN grains, a step of obtaining a mixed powder of the pretreated cBN grains and a raw material powder for a binder phase of the outermost layer 4, and a step of sintering the mixed powder, a raw material powder for the intermediate layer 5, and the body 2.

The pretreatment for surfaces of cBN grains is performed as follows to obtain cBN grains having a high surface cleanliness. First, an MN film having a very small film thickness is formed on surfaces of cBN grains. As a film forming method, for example, an atomic layer deposition (ALD) method can be used. The ALD method is a type of CVD method, and is a method of reacting a base material in a vacuum chamber with molecules of a raw material compound for each layer to repeatedly perform purge by Ar or nitrogen, thereby forming a film. Specifically, first, cBN grains as a base material are charged into a fluidized bed furnace, and the temperature in the furnace is increased to approximately 350° C. Next, a cycle of an $Ar+Al(CH_3)_3$ gas inflow step, an Ar gas purge step, an $Ar+NH_3$ gas inflow step, and an Ar gas purge step is repeatedly performed until a desired AlN film thickness is obtained. For example, an AlN film having a film thickness of approximately 5 nm can be coated on the surfaces of the cBN grains by film formation for 30 minutes.

Next, the cBN grains coated with the AlN film are heated at approximately 1,000° C. under vacuum. Accordingly, impurity elements such as oxygen of the surfaces of the cBN grains are diffused and captured in the AlN film. Finally, by mixing the cBN grains through ball-mill mixing, the AlN film capturing the impurity elements is peeled from the surfaces of the cBN grains.

By performing such a pretreatment on the cBN grains, cBN grains having a high surface cleanliness, in which impurity components such as oxygen are removed from surfaces, are obtained. The pretreatment for surfaces of cBN grains is not limited to the above-described treatment, and any method can be used as long as it is a method for removing impurity components of the surfaces of the cBN grains.

Next, the pretreated cBN grains are mixed with a raw material powder for a binder phase of the outermost layer 4 to obtain a predetermined composition, and a mixed powder is obtained. As the raw material powder for a binder phase of the outermost layer 4, a TiN powder, an Al powder, a $TiAl_3$ powder, and an $Al_2O_3$ powder can be used.

Then, the obtained mixed powder, a raw material powder for the intermediate layer 5, and the body 2 are subjected to ultra-high-pressure and high-temperature sintering. In this manner, by integrally sintering the outermost layer 4, the intermediate layer 5, and the body 2, the tip body 1 of the drilling tip according to this embodiment can be manufactured.

According to the manufacturing method of this embodiment, the outermost layer 4 having the above-described configuration can be formed by using, as cBN grains of the outermost layer 4, cBN grains of which the surface cleanliness has been increased by the pretreatment, and by subjecting the cBN grains to ultra-high-pressure and high-temperature sintering. In addition, the sintering is preferably performed at a temperature of 1,500° C. or higher with a pressure of 5.0 GPa or greater in a stable region of diamond and cubic boron nitride. Accordingly, the outermost layer 4 and the intermediate layer 5 can be simultaneously formed on the body 2. The sintering pressure is more preferably 5.5 GPa to 8.0 GPa, and the sintering temperature is more preferably 1,600° C. to 1,800° C. The above step is preferably performed to prevent oxidation of the raw material powder, and specifically, the raw material powder or molded body is preferably handled under a non-oxidizing protective atmosphere.

The drilling tip, the drilling tool, and the method of manufacturing a drilling tip according to the embodiment of the disclosure have been described, but the disclosure is not limited thereto, and can be appropriately changed without departing from the technical ideas of the disclosure. In this embodiment, a case where the disclosure is applied to a button-type drilling tip in which the tip portion of the tip body 1 has a hemispherical shape has been described as above. However, the disclosure can also be applied to a so-called ballistic-type drilling tip in which a tip portion of a tip body 1 has a shell shape, or a so-called spike-type drilling tip in which a tip portion on a posterior end side has a conical surface shape of which the diameter is reduced toward a tip side, and a tip thereof has a spherical shape with a radius smaller than that of a cylindrical posterior end portion of a tip body 1.

In addition, in this embodiment, a case where the drilling tip is applied to a drill bite has been described, but the drilling tip according to the disclosure can also be applied to a pick attached to an outer periphery of a rotation drum of a drum drilling machine for use in opencast mining or longwall mining.

EXAMPLES

Next, the effects of the disclosure will be shown using examples of a drilling tip and a drill bit according to the disclosure.

First Example

First, with examples of a cBN sintered material constituting an outermost layer as First Example, the effects of the disclosure will be shown.

cBN grains having a median diameter (D50) shown in Table 1 were used as a base material, and through an ALD method, an AlN film having an average film thickness shown in Table 1 was coated thereon. Specifically, first, cBN grains were charged into a furnace, and the temperature in the furnace was increased to 350° C. Next, using a film forming gas which was an $Al(CH_3)_3$ gas as an Al precursor and a reaction gas which was a $NH_3$ gas, a cycle of the following (1) to (4) was repeated until an AlN film having a target film thickness was formed.
(1) $Ar+Al(CH_3)_3$ gas inflow step
(2) Ar gas purge step
(3) $Ar+NH_3$ gas inflow step
(4) Ar gas purge step The cBN grains were observed by SEM, and thus an AlN film having an average film thickness shown in Table 1 was confirmed to be coated on surfaces of the cBN grains.

Next, the cBN grains coated with the AlN film were heat-treated for 30 minutes at approximately 1,000° C. under vacuum to diffuse impurity elements such as oxygen of the surfaces of the cBN grains in the AlN film. The heat-treated cBN grains were mixed through ball-mill mixing using a tungsten carbide container and balls, and the AlN film was peeled from the surfaces of the cBN grains.

A TiN powder, a TiC powder, an Al powder, a $TiAl_3$ powder, and a WC powder having an average grain size within a range of 0.3 to 0.9 μm were prepared as raw material powders for a binder phase. Two or more selected from the above raw material powders and the cBN grain powder pretreated as described above were blended such that the content of the cBN grain powder was 70 to 95 vol % in a case where the total amount of the powders was 100 vol %. Then, the mixture was subjected to wet blending and dried. Thereafter, the mixture was press-molded into dimensions of 50 mm in diameter and 1.5 mm in thickness at a molding pressure of 1 MPa using a hydraulic press to obtain a molded body. Next, the molded body was heat-treated by being held for 30 to 60 minutes at a predetermined temperature within a range of 1,000° C. to 1,300° C. under a vacuum atmosphere at 1 Pa, and was then charged into an ultra-high-pressure sintering apparatus and subjected to ultra-high-pressure and high-temperature sintering for 30 minutes at 5.0 GPa and 1,600° C. Thus, cBN sintered materials 1 to 17 of a drilling tip of the present disclosure (hereinafter referred to as "cBN sintered materials 1 to 17 of the present disclosure") shown in Table 2 were prepared.

For comparison, comparative cBN sintered materials 1 to 10 were prepared as follows. First, cBN grains a to i having a median diameter (DSO) shown in Table 4 were prepared. The cBN grains a, b, and e to i were not pretreated in the same manner as in the cases of the cBN sintered materials 1 to 17 of the present disclosure. The cBN grains c and d were pretreated in the same manner as in the cases of the cBN sintered materials 1 to 17 of the present disclosure, so that an MN film having an average film thickness shown in Table 4 was formed on surfaces of the cBN grains, and then peeled therefrom.

Two or more selected from the same raw material powders for a binder phase as in the cases of the above-described cBN sintered materials 1 to 17 of the present disclosure and the cBN grain powder were blended such that the content of the cBN grain powder was 55 to 98.2 vol % in a case where the total amount of the powders was 100 vol %. Next, the comparative cBN sintered materials 1 to 10 shown in Table 5 were manufactured in accordance with the same procedures as in the cases of the above-described cBN sintered materials 1 to 17 of the present disclosure.

Regarding the cBN sintered materials 1 to 17 of the present disclosure and the comparative cBN sintered materials 1 to 10, a binder phase structure other than cBN was confirmed by X-ray diffraction (XRD). In addition, regarding the cBN sintered materials 1 to 17 of the present disclosure and the comparative cBN sintered materials 1 to 10, the average grain size (μm) of the cBN grains and the content (vol %) of the cBN grains were measured by the above-described methods, respectively. The observation region used in the image process had a size of 15 μm×15 μm. The results are shown in Tables 2 and 5.

Figure 14:
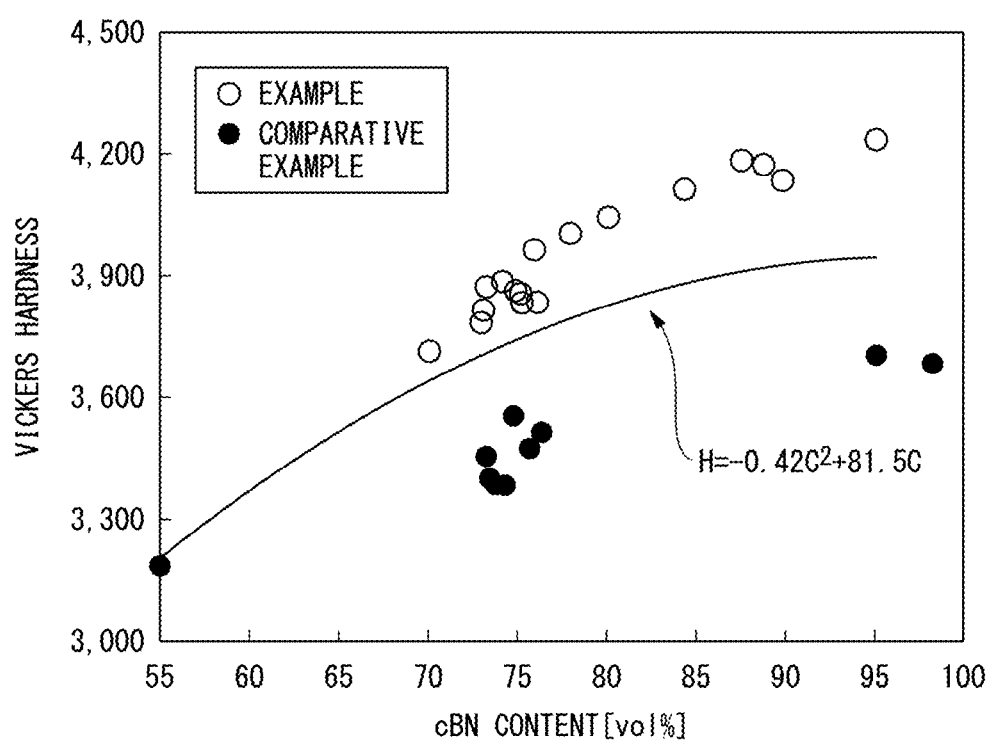
FIG. 14 is a graph illustrating the relationship between the content of cubic boron nitride grains and a Vickers hardness Hv.

At 10 points on a polished surface of each of the cBN sintered materials 1 to 17 of the present disclosure and the comparative cBN sintered materials 1 to 10, a Vickers hardness (Hv) was measured at a load of 5 kg. The average of the measured values is shown in Tables 2 and 5 as an average Vickers hardness. Each value was rounded off to the nearest 10. In addition, a graph obtained by plotting the relationship between the cBN content C (vol %) and the Vickers hardness H (Hv) of Tables 2 and 5 is shown in FIG. 14.

The presence or absence of a binder phase having a width of 1 nm or greater and 30 nm or less between neighboring cBN grains, and the presence or absence of Al, B, and N in the binder phase were confirmed by the above-described methods, respectively, and a ratio O/Al of the O content to the Al content in the binder phase was calculated by the above-described method. The ratio O/Al was measured at 5 places, and the average thereof was calculated. The results are shown in Tables 2, 3, 5, and 6. In the tables, "-" means that although a binder phase having a width of 1 nm or greater and 30 nm or less exists between neighboring cBN grains, there are no overlapping portions of Al, B, and N elements, and thus the interface boundary line could not be defined, and the ratio O/Al could not be calculated.

In addition, the presence or absence of a binder phase which had a width of 1 nm or greater and 30 nm or less and contained Al, B, and N, and in which the ratio O/Al of the O content to the Al content was 0.1 or less between neighboring cubic boron nitride grains was observed in 10 visual fields. The number of visual fields in which such a binder phase can be observed is shown in Tables 3 and 6 as the number of observation visual fields. Furthermore, in 10 visual fields, the number $Q_1$ of cBN grains, the number $q_1$ ($N_1$) of cBN grains with a binder phase, which has a width of 1 nm or greater and 30 nm or less and includes Al, B and N, between neighboring cBN grains, and the number $n_1$ of cBN grains in which the ratio O/Al of the O content to the Al content in the binder phase was 0.1 or less were obtained as described above. From the average value of $q_1/Q_1$ and the average value of $n_1/N_1$ of the visual fields, a ratio (q/Q) of cBN grains with a binder phase, which has a width of 1 nm or greater and 30 nm or less and includes Al, B and N, between neighboring cBN grains, and a ratio (n/N) of cBN grains in which ha binder phase which had a width of 1 nm or greater and 30 nm or less and contained Al, B, and N, and in which the ratio O/Al of the O content to the Al content was 0.1 or less existed between neighboring cBN grains were obtained. The results are shown in Tables 3 and 6.

TABLE 1

| Type | | Grain Size of cBN Raw Material Grains (μm) Median Diameter (D50) | AlN Film Thickness (nm) Average from SEM Image |
|---|---|---|---|
| cBN Grains | A | 0.5 | 6 |
| | B | 0.9 | 4 |
| | C | 1.7 | 7 |
| | D | 4.1 | 5 |
| | E | 5.6 | 7 |
| | F | 7.7 | 6 |
| | G | 9.6 | 8 |

TABLE 2 cBN Sintered Material

| Type | | Type of cBN Grains | Binder Phase Structure Other Than cBN (XRD) | Average Grain Size of cBN Grains (μm) | Content of cBN Grains (vol %) | Average Vickers Hardness Hv | Presence or Absence of Binder Phase Having Width of 1 nm or greater and 30 nm or less Between Neighboring cBN Grains | Presence or Absence of Al, B, and N in Binder Phase Having Width of 1 nm or greater and 30 nm or less Between Neighboring cBN Grains | | |
|---|---|---|---|---|---|---|---|---|---|---|
| | | | | | | | | Al | B | N |
| cBN Sintered Materials of the Present Disclosure | 1 | A | TiN, TiB$_2$, AlN, Al$_2$O$_3$, WC | 0.5 | 75.2 | 3860 | Present | Present | Present | Present |
| | 2 | B | TiN, TiB$_2$, AlN, Al$_2$O$_3$ | 1.1 | 70.0 | 3720 | Present | Present | Present | Present |
| | 3 | B | TiC, TiB$_2$, AlN, Al$_2$O$_3$, WC | 1.3 | 73.2 | 3880 | Present | Present | Present | Present |
| | 4 | B | TiN, TiB$_2$, AlN, Al$_2$O$_3$ | 0.9 | 75.9 | 3970 | Present | Present | Present | Present |
| | 5 | B | TiN, TiB$_2$, AlN, Al$_2$O$_3$ | 1.2 | 77.9 | 4010 | Present | Present | Present | Present |
| | 6 | B | TiN, TiB$_2$, AlN, Al$_2$O$_3$ | 1.0 | 80.0 | 4050 | Present | Present | Present | Present |
| | 7 | C | TiN, TiB$_2$, AlN, Al$_2$O$_3$, WC | 2.1 | 74.1 | 3890 | Present | Present | Present | Present |
| | 8 | C | TiN, TiB$_2$, AlN, Al$_2$O$_3$ | 1.9 | 95.0 | 4240 | Present | Present | Present | Present |
| | 9 | D | TiC, TiB$_2$, AlN, Al$_2$O$_3$, WC | 4.4 | 75.2 | 3840 | Present | Present | Present | Present |
| | 10 | E | TiN, TiB$_2$, AlN, Al$_2$O$_3$, WC | 6.2 | 74.8 | 3870 | Present | Present | Present | Present |
| | 11 | F | TiC, TiB$_2$, AlN, Al$_2$O$_3$ | 8.0 | 73.0 | 3820 | Present | Present | Present | Present |
| | 12 | G | TiN, TiB$_2$, AlN, Al$_2$O$_3$, WC | 10.4 | 72.9 | 3790 | Present | Present | Present | Present |
| | 13 | A | TiCN, TiB$_2$, AlN, Al$_2$O$_3$ | 0.5 | 84.3 | 4120 | Present | Present | Present | Present |
| | 14 | C | TiN, TiB$_2$, AlN, Al$_2$O$_3$ | 2.2 | 88.7 | 4180 | Present | Present | Present | Present |

TABLE 2-continued

| | | | | cBN Sintered Material | | | | | | |
|---|---|---|---|---|---|---|---|---|---|---|
| Type | Type of cBN Grains | Binder Phase Structure Other Than cBN (XRD) | Average Grain Size of cBN Grains (μm) | Content of cBN Grains (vol %) | Average Vickers Hardness Hv | Presence or Absence of Binder Phase Having Width of 1 nm or greater and 30 nm or less Between Neighboring cBN Grains | Presence or Absence of Al, B, and N in Binder Phase Having Width of 1 nm or greater and 30 nm or less Between Neighboring cBN Grains | | |
| | | | | | | | Al | B | N |
| 15 | F | TiN, TiB$_2$, AlN, Al$_2$O$_3$ | 8.0 | 89.8 | 4140 | Present | Present | Present | Present |
| 16 | B | TiN, TiB$_2$, AlN, Al$_2$O$_3$, WC | 0.8 | 87.5 | 4190 | Present | Present | Present | Present |
| 17 | G | TiCN, TiB$_2$, AlN, Al$_2$O$_3$ | 9.9 | 76.1 | 3840 | Present | Present | Present | Present |

TABLE 3

| | | cBN Sintered Material | | | | |
|---|---|---|---|---|---|---|
| Type | | Type of cBN Grains | O/Al (area ratio) | Number of Observation Visual Fields | q/Q | n/N |
| cBN Sintered Materials of the Present Disclosure | 1 | A | 0.02 | 10 | 0.7 | 0.8 |
| | 2 | B | 0.06 | 6 | 0.4 | 0.5 |
| | 3 | B | 0.03 | 8 | 0.6 | 0.8 |
| | 4 | B | 0.05 | 10 | 0.9 | 1.0 |
| | 5 | B | 0.07 | 10 | 0.7 | 0.8 |
| | 6 | B | 0.04 | 10 | 0.9 | 1.0 |
| | 7 | C | 0.04 | 9 | 0.7 | 0.8 |
| | 8 | C | 0.04 | 10 | 0.8 | 0.9 |
| | 9 | D | 0.08 | 10 | 0.8 | 0.8 |
| | 10 | E | 0.03 | 10 | 0.8 | 0.9 |
| | 11 | F | 0.10 | 8 | 0.5 | 0.6 |
| | 12 | G | 0.10 | 6 | 0.4 | 0.5 |
| | 13 | A | 0.07 | 10 | 0.8 | 0.8 |
| | 14 | C | 0.03 | 10 | 0.8 | 0.9 |
| | 15 | F | 0.09 | 9 | 0.7 | 0.9 |
| | 16 | B | 0.04 | 10 | 0.9 | 0.9 |
| | 17 | G | 0.09 | 8 | 0.7 | 0.8 |

TABLE 4

| | | Grain Size of cBN Raw Material Grains (μm) Median Diameter (D50) | AlN Film Thickness (nm) Average from SEM Image |
|---|---|---|---|
| cBN Grains | a | 0.4 | |
| | b | 0.9 | |
| | c | 0.9 | 4 |
| | d | 0.9 | 7 |
| | e | 1.7 | |
| | f | 4.1 | |
| | g | 5.6 | |
| | h | 7.7 | |
| | i | 9.6 | |

TABLE 5

| | | | | cBN Sintered Material | | | | | | |
|---|---|---|---|---|---|---|---|---|---|---|
| Type | | Type of cBN Grains | Binder Phase Structure Other Than cBN (XRD) | Average Grain Size of cBN Grains (μm) | Content of cBN Grains (vol %) | Average Vickers Hardness Hv | Presence or Absence of Binder Phase Having Width of 1 nm or greater and 30 nm or less Between Neighboring cBN Grains | Presence or Absence of Al, B, and N in Binder Phase Having Width of 1 nm or greater and 30 nm or less Between Neighboring cBN Grains | | |
| | | | | | | | | Al | B | N |
| Comparative cBN Sintered Material | 1 | a | TiN, TiB$_2$, AlN, Al$_2$O$_3$, WC | 0.5 | 73.8 | 3390 | Present | Absent | Absent | Absent |
| | 2 | b | TiN, TiB$_2$, AlN, Al$_2$O$_3$ | 1.1 | 76.3 | 3520 | Present | Absent | Absent | Absent |
| | 3 | c | TiN, TiB$_2$, AlN, Al$_2$O$_3$ | 0.9 | 55.0 | 3190 | Present | Present | Present | Present |
| | 4 | d | TiN, TiB$_2$, AlN, Al$_2$O$_3$, WC | 2.2 | 98.2 | 3690 | Present | Present | Present | Present |
| | 5 | e | TiN, TiB$_2$, AlN, Al$_2$O$_3$, WC | 2.1 | 74.7 | 3560 | Present | Absent | Absent | Absent |
| | 6 | e | TiN, TiB$_2$, AlN, Al$_2$O$_3$ | 2.0 | 94.6 | 3680 | Present | Absent | Absent | Absent |
| | 7 | f | TiN, TiB$_2$, AlN, Al$_2$O$_3$ | 4.3 | 75.6 | 3480 | Present | Absent | Absent | Absent |
| | 8 | g | TiN, TiB$_2$, AlN, Al$_2$O$_3$, WC | 6.2 | 74.3 | 3390 | Present | Absent | Absent | Absent |
| | 9 | h | TiC, TiB$_2$, AlN, Al$_2$O$_3$ | 8.0 | 73.4 | 3410 | Present | Absent | Absent | Absent |
| | 10 | i | TiN, TiB$_2$, AlN, Al$_2$O$_3$ | 10.4 | 73.2 | 3460 | Present | Absent | Absent | Absent |

TABLE 6

| Type | | Type of cBN Grains | O/Al (area ratio) | Number of Observation Visual Fields | q/Q | n/N |
|---|---|---|---|---|---|---|
| Comparative cBN Sintered Material | 1 | a | — | — | 0.5 | — |
| | 2 | b | — | — | 0.7 | — |
| | 3 | c | 0.10 | 1 | 0.1 | 0.5 |
| | 4 | d | 0.09 | 9 | 0.9 | 0.9 |
| | 5 | e | — | — | 0.4 | — |
| | 6 | e | — | — | 0.9 | — |
| | 7 | f | — | — | 0.6 | — |
| | 8 | g | — | — | 0.5 | — |
| | 9 | h | — | — | 0.6 | — |
| | 10 | i | — | — | 0.4 | — |

From the results shown in Tables 2, 3, 5, and 6, it was confirmed that in the cBN sintered materials 1 to 17 of the present disclosure, since the cBN grains were pretreated, a strong binder phase with few oxides which had a width of 1 nm or greater and 30 nm or less and contained Al, B, and N, and in which the ratio (O/Al) of the O content to the Al content was 0.1 or less was formed between the cBN grains. Moreover, the number of visual fields in which the binder phase which had a width of 1 nm or greater and 30 nm or less and included Al, B, and N, and in which the ratio O/Al of the O content to the Al content was 0.1 or less was observed, was 60% or more of the total number of observation visual fields. Therefore, it was confirmed that the amount of unsintered portions where the cBN grains were brought into contact with each other and could not sufficiently react with the binder phase was small. The cBN sintered materials 1 to 17 of the present disclosure were also confirmed to have a Vickers hardness (Hv) of greater than 3,700.

In the comparative cBN sintered materials 3 and 4, since the cBN grains were pretreated, the ratio (O/Al) of the O content to the Al content was 0.1 or less on average, and the amount of oxides was small. However, since the cBN content was less than 70 vol % or greater than 95 vol %, the Vickers hardness (Hv) was low. In addition, due to the unpretreated cBN grains, the comparative cBN sintered material 6 had a lower Vickers hardness (Hv) than the cBN sintered material 8 of the present disclosure having the same cBN grain content. In all other comparative cBN sintered materials 1, 2, 5, and 7 to 10, the ratio (O/Al) of the O content to the Al content was greater than 0.1, and thus the Vickers hardness (Hv) was low.

As can be seen from FIG. 14, the Vickers hardness of the cBN sintered materials 1 to 17 of the present disclosure was positioned above the curve represented by $H=-0.42 C^2+81.5 C$ (H represents a Vickers hardness, and C represents a cBN content by vol %). In contrast, the Vickers hardness of all of the comparative cBN sintered materials 1 to 10 was positioned below the curve. From these facts, it was found that the Vickers hardness of the cBN sintered materials of the present disclosure was higher than that of the comparative cBN sintered materials even in a case where these had the same cBN grain content. In FIG. 14, the curve represents the relationship between the cBN grain content and the Vickers hardness of the cBN sintered materials obtained by experiences.

Second Example

Next, the effects of the disclosure will be shown using examples of a drilling tip in which the above-described cBN sintered material of the present disclosure is applied to an outermost layer as Second Example.

A cBN grain powder having a grain size of 4.1 μm and pretreated in the same manner as in First Example, and raw material powders for a binder phase, including a TiN powder having a grain size of 0.5 μm, an Al powder having a grain size of 0.3 μm, a TiAl₃ powder having a grain size of 0.5 μm, and a WC powder having a grain size of 0.8 μm, were blended such that the content of the cBN grain powder was as shown in Table 7 in a case where the total amount of the powders was 100 vol %. Then, the mixture was subjected to wet blending and dried. In this manner, raw material powders for an outermost layer of Examples 1 to 4 of present disclosure were obtained. An unpretreated cBN powder having a grain size of 9.6 μm, a W powder having a grain size of 4 μm, an Al powder having a grain size of 0.9 μm, and a Co powder having a grain size of 3 μm were blended as shown in Table 8. Then, the mixture was subjected to wet blending and dried. Accordingly, raw material powders for an intermediate layer of Examples 1 to 3 were obtained. In addition, diamond grains having a grain size of 8 μm, a Co powder having a grain size of 3.7 μm, and a WC powder having a grain size of 2.1 μm were blended such that the content of the diamond grains was as shown in Table 8 in a case where the total amount of the powders was 100 vol %. Then, the mixture was subjected to wet blending and dried. Accordingly, a raw material powder for an intermediate layer of Example 4 was obtained.

The raw material powders for an outermost layer and the raw material powders for an intermediate layer of Examples 1 to 4 were integrally sintered together with a body made of a cemented carbide containing 94 wt % of WC and 6 wt % of Co under conditions of a sintering pressure of 6.0 GPa, a sintering temperature of 1,600° C., and a sintering time of 20 minutes. Accordingly, button tips (drilling tips) according to Examples 1 to 4, having a radius of 5.5 mm and a length of 16 mm in a tip central line direction, were manufactured. The radius of a hemispherical tip portion of a tip body was 5.75 mm. In addition, the layer thicknesses of the outermost layer and the intermediate layer in the tip central line direction were as shown in Tables 7 and 8.

As Comparative Examples related to Examples 1 to 4 of present disclosure, a button tip (Comparative Example 1) in which hard grains of an outermost layer were not cBN grains, but were diamond grains, a button tip (Comparative Example 2) in which a metallic catalyst was used as a binder phase of an outermost layer, a button tip (Comparative Example 3) in which the content of cBN grains contained in an outermost layer was less than 70 vol %, a button tip (Comparative Example 4) in which no intermediate layer was provided, and a button tip (Comparative Example 5) in which the content of cBN grains contained in an outermost layer was greater than 95 vol % were manufactured. The button tips of Comparative Examples 1 to 5 all had the same dimensions as Examples 1 to 4 of present disclosure.

Unpretreated hard grains (diamond grains or cBN grains) were used in the outermost layers of the button tips of Comparative Examples 1 and 2. Specifically, regarding the button tip of Comparative Example 1, diamond grains having a grain size of 8 μm, a Co powder having a grain size of 3 μm, and a WC powder having a grain size of 2.7 μm were blended such that the content of the diamond grains was as shown in Table 7 in a case where the total amount of the powders was 100 vol %. Then, the mixture was subjected to wet blending and dried. In this manner, a raw material powder for an outermost layer was obtained. This raw material powder for an outermost layer and the same raw material powder for an intermediate layer as used in Examples 1 to 4 of present disclosure were integrally sintered together with a body made of the same cemented carbide as used in Examples 1 to 4 of present disclosure under conditions of a sintering pressure of 5.4 GPa, a sintering temperature of 1,450° C., and a sintering time of 5 minutes.

Regarding the button tip of Comparative Example 2, an unpretreated cBN grain powder having a grain size of 4.1 μm, a W powder having a grain size of 1.5 μm, an Al powder having a grain size of 0.3 μm, and a Co powder having a grain size of 3 μm were blended such that the content of the cBN grain powder was as shown in Table 7 in a case where the total amount of the powders was 100 vol %. Then, the mixture was subjected to wet blending and dried. In this manner, a raw material powder for an outermost layer was obtained. This raw material powder for an outermost layer and the same raw material powder for an intermediate layer as used in Examples 1 to 4 of present disclosure were integrally sintered together with a body made of the same cemented carbide as used in Examples 1 to 4 of present disclosure under conditions of a sintering pressure of 5.0 GPa, a sintering temperature of 1,600° C., and a sintering time of 30 minutes.

The button tips of Comparative Examples 3 and 5 were prepared in the same manner as in Examples 1 to 4 of present disclosure. The button tip of Comparative Example 4 was prepared in the same manner as in Examples 1 to 4 of present disclosure, except that no intermediate layer was provided. In addition, the layer thicknesses of the outermost layer and the intermediate layer in a tip central line direction of Comparative Examples 1 to 5 were as shown in Tables 7 and 8.

In cross sections, passing through the tip central line C, of the outermost layers formed using the pretreated cBN grains of Examples 1 to 4 of present disclosure and Comparative Examples 3 to 5, the presence or absence of a binder phase having a width of 1 nm or greater and 30 nm or less between neighboring cBN grains, and the presence or absence of Al, B, and N in the binder phase were confirmed by the above-described methods, respectively, and the ratio (O/Al) of the O content to the Al content in the binder phase was calculated by the above-described method. The results are shown in Table 7 in addition to the Vickers hardness of the outermost layers.

For each of the drilling tips of Examples 1 to 4 of present disclosure and Comparative Examples 1 to 5, two drilling tips were attached on a face surface of a bit body having a bit diameter of 45 mm as illustrated in FIG. 2, and five drilling tips were attached on a frustconical gauge face to produce 7 types of drill bits having a total of seven drilling tips. Using these drill bits, drilling was performed to form a plurality of boreholes with a drilling length of 4 m in a nickel ore mine. Thereby a total drilling length (m) until the drilling tip life was measured and a tip damage state was confirmed when the drilling tip life was reached. A case where the outermost layer in the button tip was gradually worn without the occurrence of fractures such as chipping was determined as normal wear. When a worn region (wear amount) increased, and finally, the gauge diameter became equal to the outer diameter of the bit body, it was determined that the tool life of the bit was reached. When two or more fractures occurred in the tip body, and due to the influence thereof, the drilling speed was reduced, it was also determined that the tool life of the bit was reached.

Regarding drilling conditions, the drilling machine used was H205D manufactured by TAMROCK, the striking pressure was 160 bar, the feed pressure was 80 bar, the rotating pressure was 55 bar, and the pressure of water supplied from a blow hole was 18 bar. The results are shown in Table 8.

TABLE 7

| | | | Outermost Layer | | | | | | |
|---|---|---|---|---|---|---|---|---|---|
| | Type of Hard Grains | Content of Hard Grains (vol %) | Composition of Binder Phase | Layer Thickness (mm) | Presence or Absence of Binder Phase Having Width of 1 nm or greater and 30 nm or less Between Neighboring cBN Grains | Presence or Absence of Al, B, and N in Binder Phase Having Width of 1 nm or greater and 30 nm or less Between Neighboring cBN Grains | | | Vickers Hardness |
| | | | | | | Al | B | N | O/Al |
| Example 1 | cBN | 91 | TiN, TiB$_2$, AlN, Al$_2$O$_3$, WC | 1.2 | Present | Present | Present | Present | 0.09 | 4200 |
| Example 2 | cBN | 82 | TiN, TiB$_2$, AlN, Al$_2$O$_3$, WC | 1 | Present | Present | Present | Present | 0.04 | 4000 |
| Example 3 | cBN | 73 | TiN, TiB$_2$, AlN, Al$_2$O$_3$, WC | 0.8 | Present | Present | Present | Present | 0.04 | 3700 |
| Example 4 | cBN | 73 | TiN, TiB$_2$, AlN, Al$_2$O$_3$, WC | 0.8 | Present | Present | Present | Present | 0.04 | 3700 |
| Comparative Example 1 | Diamond | 85 | Co, WC | 0.4 | — | — | — | — | — | 4100 |
| Comparative Example 2 | cBN | 85 | Co, CoWB, B$_6$Co$_{21}$W$_2$, Al$_2$O$_3$ | 0.8 | — | — | — | — | — | 4000 |
| Comparative Example 3 | cBN | 50 | TiN, TiB$_2$, AlN, Al$_2$O$_3$, WC | 0.6 | Present | Present | Present | Present | 0.05 | 3300 |
| Comparative Example 4 | cBN | 82 | TiN, TiB$_2$, AlN, Al$_2$O$_3$, WC | 2.4 | Present | Present | Present | Present | 0.09 | — |
| Comparative Example 5 | cBN | 98 | TiN, TiB$_2$, AlN, Al$_2$O$_3$, WC | 2.4 | Present | Present | Present | Present | 0.09 | — |

TABLE 8

| | Type of Hard Grains | Content of Hard Grains (vol %) | Composition of Binder Phase | Layer Thickness (mm) | Drilling Length (m) Until Tip Life is Reached | Tip Damage State |
|---|---|---|---|---|---|---|
| | | | Intermediate Layer | | | |
| Example 1 | cBN | 65 | Co, CoWB, $B_6Co_{21}W_2$, $Al_2O_3$ | 0.4 | 720 | Normal Wear |
| Example 2 | cBN | 55 | Co, CoWB, $B_6Co_{21}W_2$, $Al_2O_3$ | 0.6 | 648 | Normal Wear |
| Example 3 | cBN | 40 | Co, CoWB, $B_6Co_{21}W_2$, $Al_2O_3$ | 0.8 | 472 | Normal Wear |
| Example 4 | Diamond | 55 | Co, WC | 0.6 | 480 | Normal Wear |
| Comparative Example 1 | cBN | 55 | Co, CoWB, $B_6Co_{21}W_2$, $Al_2O_3$ | 0.6 | 124 | Fractures |
| Comparative Example 2 | cBN | 55 | Co, CoWB, $B_6Co_{21}W_2$, $Al_2O_3$ | 0.8 | 84 | Fractures |
| Comparative Example 3 | cBN | 55 | Co, CoWB, $B_6Co_{21}W_2$, $Al_2O_3$ | 0.4 | 56 | Normal Wear |
| Comparative Example 4 | — | — | — | — | — | Cracks During Sintering |
| Comparative Example 5 | cBN | 55 | Co, CoWB, $B_6Co_{21}W_2$, $Al_2O_3$ | 0.4 | — | Cracks During Sintering |

In the drill bit having the drilling tip of Comparative Example 1 attached thereon, in which the hard layer was formed of a polycrystalline diamond sintered material, the drilling length was 124 m, and the drilling tip life was reached due to fractures. In addition, in the drill bit having the drilling tip of Comparative Example 2 attached thereon, in which the cBN sintered material of the outermost layer was formed using a metallic catalyst, the drilling length did not reach 100 m, and the drilling tip life was reached due to fractures. In the drill bit having the drilling tip of Comparative Example 3 attached thereon, in which the content of the cBN grains of the outermost layer was small, the drilling tip life was reached due to normal wear, but the drilling length did not reach 100 m. In Comparative Example 4 in which no intermediate layer was provided, cracks occurred during sintering, and thus it was not possible to perform the drilling using the drilling tip of Comparative Example 4. In Comparative Example 5 in which the content of the cBN grains of the outermost layer was large, cracks occurred during sintering due to ununiformity during sintering in the outermost layer, and thus it was not possible to perform the drilling using the drilling tip of Comparative Example 5.

On the other hand, with the drill bits having the drilling tips of Example 1 to 4 of present disclosure attached thereon, respectively, 400 m or more of drilling was possible even in Example 3 of present disclosure in which the drilling length was the shortest.

INDUSTRIAL APPLICABILITY

As described above, a drilling tip according to the disclosure has a hardness comparable to a polycrystalline diamond sintered material, and thus secures wear resistance and can be used in Fe or Ni mines or under high-temperature drilling conditions. Therefore, the drilling tip is suitable for bits for mine drilling, bits for construction drilling, bits for oil and gas (O & G) drilling, and picks of drum drilling machines for use in opencast mining or longwall mining.

REFERENCE SIGNS LIST

1: tip body
2: body
3: hard layer
4: outermost layer
5: intermediate layer
10: cBN grains
11: bit body
20: binder phase
C: tip central line
O: axial line of bit body 11

The invention claimed is:

1. A drilling tip which is attached to a tip portion of a drilling tool to perform drilling, the drilling tip comprising:
a tip body which is provided with a posterior end portion buried in the drilling tool, and a tip portion protruding from a surface of the drilling tool and being tapered toward a tip side of the tip body; and
a hard layer which is formed on a surface of the tip portion of the tip body, wherein
the hard layer is provided with an outermost layer and an intermediate layer interposed between the outermost layer and the tip body,
the outermost layer is a cubic boron nitride sintered material having 70 to 95 vol % of cubic boron nitride grains and a binder phase that binds the cubic boron nitride grains to each other, and
when a cross-sectional structure of the outermost layer is observed, the binder phase having a width of 1 nm or greater and 30 nm or less and containing Al, B, and N, and in which a ratio (atomic ratio) of an O content to an Al content is 0.1 or less exists between neighboring cubic boron nitride grains.

2. The drilling tip according to claim 1, wherein the outermost layer has a Vickers hardness of 3,700 to 4,250.

3. The drilling tip according to claim 1, wherein the cubic boron nitride grains have an average grain size of 0.5 to 8.0 μm.

4. The drilling tip according to claim 1, wherein when a cross-sectional structure of the outermost layer is observed, a ratio of: a number of cubic boron nitride grains which have the binder phase having a width of 1 nm or greater and 30 nm or less, and containing Al, B and N between neighboring cubic boron nitride grains: to a total number of the cubic boron nitride grains, is 0.4 or greater, and
a ratio of: a number of cubic boron nitride grains which have the binder phase having a width of 1 nm or greater and 30 nm or less, containing Al, B and N, and having an atomic ratio of an O content to an Al content of 0.1 or less between neighboring cubic boron nitride grains:

to the number of cubic boron nitride grains which have the binder phase having a width of 1 nm or greater and 30 nm or less and containing Al, B and N between neighboring cubic boron nitride grains, is 0.5 or greater.

5. The drilling tip according to claim 1, wherein the intermediate layer contains 30 to 70 vol % of cubic boron nitride grains or diamond grains.

6. A drilling tool, comprising:
a bit body; and
the drilling tip according to claim 1 which is attached on a tip portion of the bit body.

7. A method of manufacturing the drilling tip according to claim 1, the method comprising the steps of:
pretreating surfaces of cubic boron nitride grains to form an AlN film;
obtaining a mixed powder by mixing a raw material powder for a binder phase of the outermost layer and the pretreated cubic boron nitride grains; and
sintering the mixed powder, a raw material powder for the intermediate layer, and the tip body at a pressure of 5.0 GPa or greater and a temperature of 1,500° C. or higher.

8. The drilling tip according to claim 1, wherein the binder phase is formed of ceramics.

* * * * *